United States Patent [19]

Joy et al.

[11] 4,028,717
[45] June 7, 1977

[54] FIELD EFFECT TRANSISTOR HAVING IMPROVED THRESHOLD STABILITY

[75] Inventors: Richard C. Joy; Ingrid E. Magdo, both of Hopewell Junction; Alfred Phillips, Jr., Wappingers Falls, all of N.Y.

[73] Assignee: IBM Corporation, Armonk, N.Y.

[22] Filed: Sept. 22, 1975

[21] Appl. No.: 615,251

[52] U.S. Cl. .................................. 357/23; 357/90; 357/91
[51] Int. Cl.² .......................................... H01L 29/78
[58] Field of Search .................. 357/20, 23, 90, 91

[56] References Cited
UNITED STATES PATENTS

| | | | |
|---|---|---|---|
| 3,397,326 | 8/1968 | Gallagher et al. | 357/23 |
| 3,408,543 | 10/1968 | Ono et al. | 357/23 |
| 3,767,487 | 10/1973 | Steinmaier | 357/23 |
| 3,936,857 | 2/1976 | Ota | 357/23 |

OTHER PUBLICATIONS

D. Jadus, "Buried Field Effect Transistor," IBM Tech. Discl. Bull., vol. 13, No. 6, Nov. 1970, pp. 1431–1432.

Primary Examiner—Michael J. Lynch
Assistant Examiner—Joseph E. Clawson, Jr.
Attorney, Agent, or Firm—Wolmar J. Stoffel

[57] ABSTRACT

An improved field effect transistor device in a monocrystalline semiconductor body provided with source and drain regions and a gate electrode disposed over the channel between the source and drain regions wherein at least the drain region is formed of a first region where the impurity concentration increases with depth with the peak concentration being spaced inwardly from the major surface, and a second region located within the first region having a peak impurity concentration at the major surface. The drain region structure in operation promotes the current flow between the source and drain to flow deeper in the channel region and spaced from the gate dielectric layer.

In the method for forming the field effect transistor, an impurity is introduced into the semiconductor body underlying at least the ultimate drain region, an epitaxial semiconductor layer deposited, and a second impurity region formed over the first region to form the drain contact.

In an alternate embodiment of the method for forming a field effect transistor, a first ion implantation is formed in the drain region, such that the peak impurity concentration is located well within the body spaced from the surface thereof, and a second ion implantation, or diffusion, performed forming the source and also the ohmic contact for the drain which is located over the first region and within the first implanted region.

7 Claims, 12 Drawing Figures

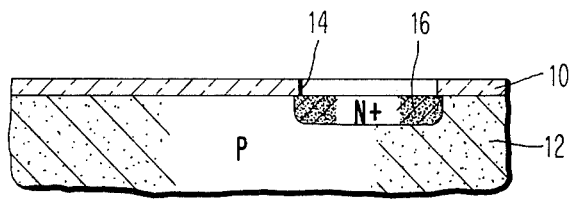
FIG. 1
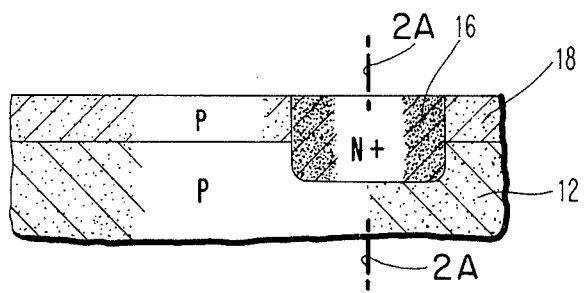 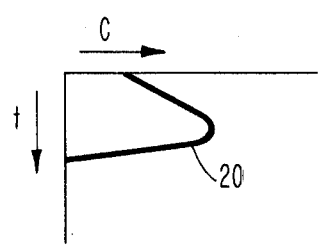
FIG. 2  FIG. 2A
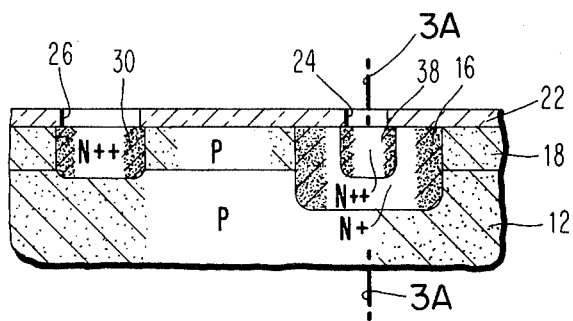 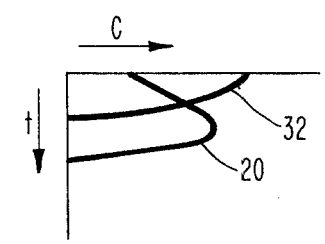
FIG. 3  FIG. 3A
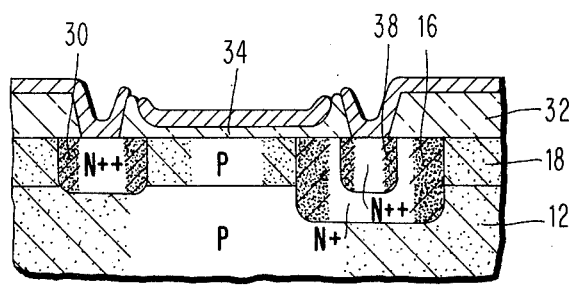
FIG. 4

FIELD EFFECT TRANSISTOR HAVING IMPROVED THRESHOLD STABILITY

BACKGROUND OF THE INVENTION

This invention relates to an improved insulated gate field effect transistor and more particularly to an improved insulated gate field effect transistor provided with a novel drain region that promotes current flow deeper within the channel region of the device.

Field effect transistors are well known in the art and are comprised of a conductive gate electrode spaced from the surface of a suitably doped semiconductor body of a first conductivity type by a thin dielectric material. Source and drain electrodes are defined by spaced low resistance regions of opposite conductivity type in the semiconductor body. An electric field, usually generated by the metallic or conductive gate electrode, modulates the carrier density along the conduction channel between the source and drain electrodes.

The development of semiconductor devices, and the field effect transistor devices in particular, has the objective of improving performance by increasing the density, reducing capacitance, and increasing the sensitivity and the speed of operation. In increasing density, the channel region was shortened, which resulted in greater packing density and faster response. However, as the channel length was reduced, constraints were placed on the operating voltage of the device. Avalanche multiplication voltage of short N-channel insulated gate field effect transistor devices proved to be quite low. For a given operating voltage, this limits the minimum channel length of N-channel devices, and vice versa, a given minimum channel length limits the operating voltage. For a given FET having a short channel length, the electric field near the drain region is very high. When the voltage between the source and drain is increased, avalanching occurs first adjacent to the drain region near the surface of the device. Electrons and holes are generated by the avalanching phenomenon with a portion of the electrons being lodged in the dielectric layer between the gate and the body. This results in a negative charge which is permanent in nature that materially affects the threshold voltage of the device. Thus, as the channel length of the field effect transistor becomes shorter, the allowable operating voltage between the source and drain becomes smaller. The same situation exists with respect to P-channel devices but to a lesser extent.

In addition to the avalanching situation, electrons can become trapped in the gate dielectric to adversely affect the threshold stability of an FET during pre-avalanche operation. In normal operation of an FET, a voltage is impressed across the source and drain. This voltage difference creates an electric field which will cause current or electron flow. In current flow through semiconductor material, some energetic electrons are present which have sufficient energy to overcome the barrier presented by the semi-conductor-gate dielectric interface barrier. Electrons that escape into the dielectric can become trapped in the dielectric. If the dielectric has an $Si_3N_4$—$SiO_2$ interface, the trapping probability is several orders of magnitude greater than with a simple $SiO_2$ gate dielectric. Trapped electrons result in a permanent charge in the dielectric which alters the threshold voltage of the device, as well as other electrical characteristics. The shorter the channel length, the greater the electric field that is generated. The greater the field, the greater is the probability of an electron achieving sufficient energy to traverse the barrier. Since the trend in FET design is to smaller devices with shorter channel lengths, it is apparent that the deterioration of threshold stability due to trapped electrons in the gate dielectric is a significant and possibly limiting consideration. The same basic situation exists in a P-channel device as in the aforedescribed N-channel device but to a lesser extent.

SUMMARY OF THE INVENTION

An object of this invention is to provide an improved field effect transistor that has greatly improved threshold stability.

It is another object of this invention to provide an improved field effect transistor having a short channel length and a relatively high operating voltage.

Yet another object of this invention is to provide in a field effect transistor a novel drain regain which causes current to flow more deeply in the channel region of the device.

Another object of this invention is to provide new methods for fabricating an improved field effect transistor with greater threshold stability.

In accordance with the aforementioned objects of this invention, there is presented an improved field effect transistor with source and drain regions defining a channel in a semiconductor substrate of a first type conductivity, the improvement being at least a drain region formed of a first region of a second opposite type conductivity wherein the impurity concentration increases with depth, the peak concentration being spaced inwardly from the major surface, and a second region of a second type conductivity located within the first region and having a peak impurity concentration at the major surface thereof.

In the method of the invention for forming a field effect transistor having a novel drain structure, an impurity opposite to the background impurity of the monocrystalline body is introduced in the vicinity of the drain region, an epitaxial layer deposited on the surface of the body, and a second region formed at the surface wherein the peak impurity concentration is at the surface of the epitaxial layer.

Another method for forming an improved field effect transistor consists of forming at least the drain region by introducing by ion implantation an impurity opposite in conductivity to the background impurity into the monocrystalline body such that the peak impurity concentration is located well beneath the surface, and subsequently implanting or diffusing a second impurity within the first region such that the peak impurity concentration is at or adjacent the surface.

BRIEF DESCRIPTION OF THE DRAWINGS

FIGS. 1–4 are a sequence of elevational views in broken section that illustrate a preferred method embodiment of the invention for fabricating a short channel FET transistor of the invention.

FIGS. 2A and 3A are impurity concentration profiles of device structures illustrated in FIGS. 2 and 3 taken on lines 2A and 3A respectively.

DESCRIPTION OF THE PREFERRED EMBODIMENTS

Figure 5:
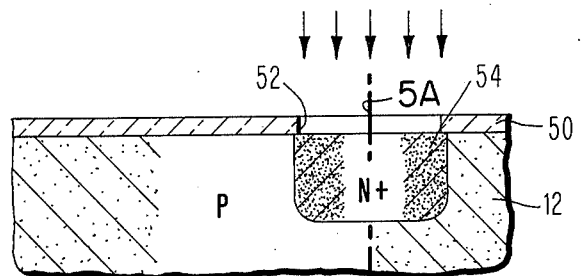
FIGS. 5–7 are a sequence of elevational views in broken section that illustrate another preferred method embodiment of the invention for fabricating an improved FET transistor of the invention.

A basic approach in reducing the electron injection into the gate dielectric of an FET in this invention is to reduce the energy of the electrons in the critical zone, i.e. in the region adjacent the drain region near the surface of the device. The energy of electrons is reduced by two effects, i.e. (1) phonon collisions and (2) impact ionization. A basic objective in the improved FET of the invention is to cause the flow of electrons deeper into the channel region, particularly in the region adjacent to the drain region. When the electrons flow deeper in the device, there is provided a buffer layer of semiconductor material between the major flow path and the gate dielectric which will reduce the energy of the electrons by both of the previously mentioned effects. When this is accomplished effectively, the number of electrons that arrive at the semiconductor material-gate dielectric layer interface is materially reduced and the threshold voltage stability is thus significantly improved.

In this structure, the channeling of the flow of electrons is achieved by providing a drain region that has a lower resistance located at a depth below the surface of the device and away from the semiconductor material-gate dielectric layer interface. In order to provide the necessary ohmic contact for the drain, a second region is provided having a low resistivity region at the surface and which is located within the drain region. The structure and operation of the invention, as well as the methods of making the structure, will be discussed in more detail with reference to the drawings.

Referring now to the drawing, FIG. 1 illustrates the first process step in fabricating the improved FET structure of the invention. A masking layer 10 is formed on a monocrystalline semiconductor body 12 by any suitable technique, as for example thermally oxidizing the surface of body 12 in an oxidizing environment. Body 12 can be provided with any suitable doping concentration as for example a background doping with a concentration from $2 \times 10^{15}$ to $6 \times 10^{16}$ when the material is monocrystalline silicon. An opening 14 is made in masking layer 10 using photolithographic and etching techniques that are well known in the art. Opening 14 is located to define the drain region of the ultimate FET device. An impurity is then diffused through opening 14 forming region 16. The impurity in region 16 is opposite that of the background impurity in body 12. The surface concentration of the region 16 will vary somewhat depending on whether the region is formed of N or P-type impurity. When the impurity is N-type, as illustrated in FIG. 1, the surface concentration is normally in the range of $10^{19}$ to $10^{21}$ atoms/cc. When the impurity region is formed of a P-type impurity in a substrate 12 having an N-type background impurity, the surface concentration is normally in the range of $10^{18}$ to $5 \times 10^{20}$ atoms/cc.

After the masking layer 10 is removed, an epitaxial layer 18 is deposited on the body 12 as shown in FIG. 2. As the layer is deposited, the impurity in region 16 will diffuse upwardly forming an N-type region that substantially extends through layer 18. As indicated in FIG. 2A, in the concentration versus thickness impurity profile 20, the peak impurity concentration in region 16 occurs at the interface of the body 12 and the epitaxial layer 18. In general, the epitaxial layer has a thickness in the range of 0.4 to 3 micrometers, more preferably in the range of 0.5 to 1.5 micrometers. The impurity concentration at the interface i.e. at the peak of the curve in FIG. 2 is dependent somewhat on the impurity conductivity type of region 16. When the region is of N-type conductivity, the peak impurity is preferably in the range of $10^{19}$ to $10^{21}$ atoms/cc. When the impurity conductivity is P-type, the peak concentration is in the range of $10^{18}$ to $5 \times 10^{20}$ atoms/cc. In general, the concentration of the impurity in region 16 at the surface is significantly lower being in the range of $10^{17}$ to $10^{19}$ for N-type conductivity and $10^{16}$ to $10^{18}$ for P-type conductivity.

Subsequently, a second masking layer 22 is deposited on the surface of epitaxial layer 18 as shown in FIG. 3. Openings 24 and 26 are formed in layer 22 using conventional photolithographic and etching techniques. These openings are made for subsequent diffusions to form the second region in the drain region and also the source. As indicated in FIG. 3, opening 24 is located within the area of region 16. A suitable impurity is then diffused through openings 24 and 26 forming regions 38 and 30. As indicated in FIG. 3A, the impurity concentration is highest at the surface of layer 18 as indicated by curve 32. The surface concentration of regions 30 and 38 must be sufficiently high to form an ohmic contact to the source and drain regions. In general, when the region is of P-type conductivity, the surface concentration must be $10^{18}$ atoms/cc or higher. When the conductivity is N-type, the surface concentration should be $10^{21}$ atoms/cc or higher.

As indicated in FIG. 4, the field effect transistor device is completed by forming a relatively thick dielectric layer 32 over the field region of the device and a relatively thin gate dielectric layer 34 over the channel region of the device. Suitable metallurgy contacts are made to the source and drain, and channel regions as indicated which is a technology well known in the art. In FIGS. 1–4, there is disclosed a process wherein the drain region 16 and 38 has two separate regions wherein the source region 30 has a single region. However, the source can be formed of two regions similar to that illustrated with respect to the drain region, if desired. This modification has the advantage that the resultant field effect transistor structure can be used interchangeably, i.e. the source and drain interchanged. In operation, the electrons that flow from the source to drain will flow deeper than the high electric field drain depletion region because of the higher conductivity at the interface of the epitaxial layer and the body 12. Thus, the energetic electrons having sufficient energy to penetrate the semiconductor gate dielectric interface will be separated from the interface by a significant amount of semiconductor material which will provide a buffer so that energetic electrons can lose energy before they reach the interface.

Figure 5A:
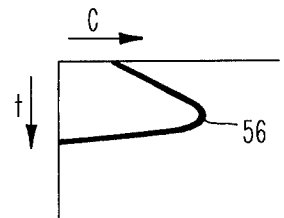
FIGS. 5A and 6A are impurity concentration profiles of device structures illustrated in FIGS. 5 and 6 taken in lines 5A and 6A respectively.
Figure 6:
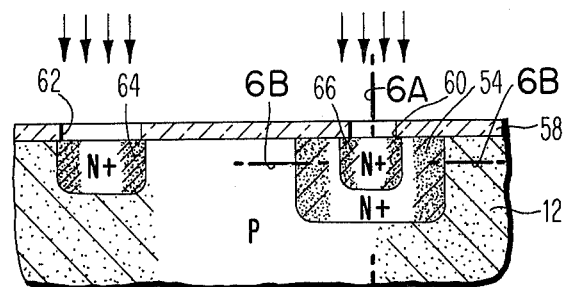
Figure 6A:
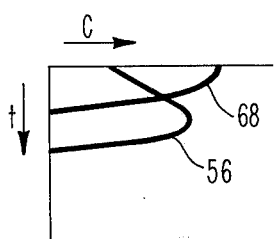
Figure 6B:
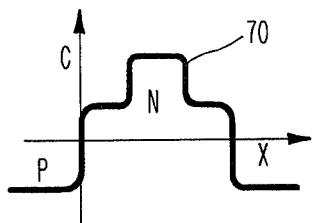
FIG. 6B is an impurity concentration profile of the device structure of FIG. 6 taken on line 6B.
Figure 7:
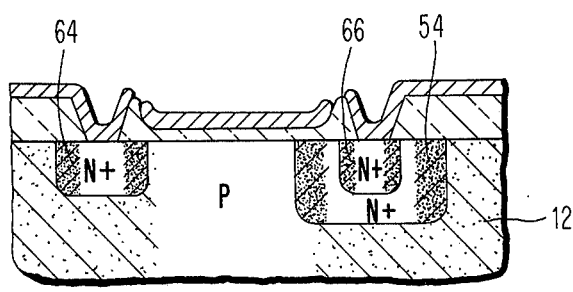

Referring now to FIGS. 5–7, there is illustrated another method embodiment of forming the improved field effect transistor structure of the invention. As illustrated in FIG. 5, a masking layer 50 is formed on monocrystalline semiconductor body 12 and opening 52 formed for the drain region implant. A first ion implant of a suitable type conductivity ion is made forming region 54. The implant energy is adjusted so that the peak concentration occurs at a depth well below the surface of body 12. The impurity concentration is illustrated by curve 56 in FIG. 5A. As indicated in FIG. 6, masking layer 50 is removed and a second masking layer 58 deposited. Openings 60 and 62 are formed for forming a second ion implant operation. Ions are implanted through openings 60 and 62 for forming the source region 64 and a second region 66 in the drain. The impurity concentration of regions 64 and 66 reach a peak at or closely adjacent to the surface as indicated by curve 68 in FIG. 6A. This permits making an ohmic contact to the source and drain regions. In the implanation of region 54, the impurity selected should be one that can provide deep penetration into the semiconductor body. An N-type impurity that satisfies this requirement best is phosphorous, and to a lesser extent arsenic and antimony. P-type conductivity impurities that satisfy this requirement are boron and gallium. The impurity concentration of the drain region is illustrated in FIG. 6B. Note that curve 70 taken on the section indicated in FIG. 6 indicates that the region 54 has a relatively low concentration whereas the concentration in the region 66 is significantly higher. As indicated schematically in FIG. 7, the device is completed by making electrical contact to the source, drain and the gate. As with the foregoing method embodiment of the improved structure, it may be advantageous to form both the source and drain with two regions similar to the drain region indicated in FIGS. 5–7. Also, region 66 may be formed by a diffusion similar to the struction mentioned in FIGS. 1–4.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. An improved insulated gate field effect transistor comprising
a semiconductor substrate of a first conductivity type having source and drain regions of a second opposite type conductivity formed in a major surface thereof and defining a channel region;
a gate electrode overlying said channel region,
a layer of dielectric material underlying said gate electrode,
at least said drain region having a first region of a second type conductivity wherein the impurity concentration increases with depth, the peak concentration being spaced inwardly from said major surface, said first region defining a side of said channel region, and a second region of said second type conductivity located and encompassed within said first region and having a peak impurity concentration at said major surface, and
a drain electrode in ohmic contact with said second region.

2. The field effect transistor of claim 1 wherein said peak impurity concentration of said first region of said drain region is located at a depth from the major surface in the range of 0.1 to 2 micrometers.

3. The field effect transistor of claim 2 wherein said peak impurity concentration of said first region of said drain region is in the range of $10^{17}$ to $10^{21}$ atoms/cc.

4. The field effect transistor of claim 2 wherein said second region of said drain region is located centrally of said first region.

5. The field effect transistor of claim 1 wherein the distance between said source and said drain region is in the range of 0.5 to 20 micrometers.

6. The field effect transistor of claim 1 wherein the surface impurity concentration of said source and said second region of said drain region is in the range of $10^{18}$ to $2.5 \times 10^{21}$ atoms/cc.

7. The field effect transistor of claim 1 wherein said substrate comprises a monocrystalline silicon body, and an overlying epitaxial silicon layer, said peak impurity concentration of said first region of said drain located near the interface of said body and said epitaxial layer.

* * * * *